United States Patent
Lee

(10) Patent No.: US 6,479,390 B1
(45) Date of Patent: Nov. 12, 2002

(54) METHOD OF ETCHING MATERIAL FILM FORMED ON SEMICONDUCTOR WAFER USING SURFACE WAVE COUPLED PLASMA ETCHING APPARATUS

(75) Inventor: Cheol-kyu Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/556,733

(22) Filed: Apr. 21, 2000

(30) Foreign Application Priority Data

Jul. 13, 1999 (KR) .............................................. 99-28209

(51) Int. Cl.[7] ............................................. H01L 21/302
(52) U.S. Cl. ........................ 438/706; 438/714; 438/723
(58) Field of Search ..................... 204/298.38; 118/723; 156/345; 438/706, 707, 714, 723

(56) References Cited

U.S. PATENT DOCUMENTS

| | | | | |
|---|---|---|---|---|
| 4,676,867 A | * | 6/1987 | Elkins et al. ................ 156/643 |
| 5,545,258 A | * | 8/1996 | Katayama et al. ..... 118/723 MP |
| 5,645,644 A | * | 7/1997 | Mabuchi et al. ..... 118/723 MW |
| 5,955,382 A | * | 9/1999 | Yamauchi et al. ........... 438/726 |
| 6,136,722 A | * | 10/2000 | Nambu ........................ 438/723 |
| 6,228,210 B1 | * | 5/2001 | Lee .............................. 156/345 |

* cited by examiner

*Primary Examiner*—Robert Kunemund
*Assistant Examiner*—Duy-Vu Deo
(74) *Attorney, Agent, or Firm*—F. Chau & Associates, LLP

(57) ABSTRACT

A method of etching a material film formed on a semiconductor wafer loaded onto a reaction chamber of a surface wave coupled plasma etching apparatus having an insulation plate which is capable of generating surface waves by microwaves, and a glass plate placed below the insulation plate, for transmitting the produced surface waves. In the method, the glass plate is rapidly pre-heated by generating an argon (Ar) or xenon (Xe) surface wave coupled plasma which has a high ion density and a large mass, and the material layer is then etched. Therefore, the preheating time of the glass plate can be sharply reduced to less than five minutes. Also, because the etching gas is not used for the heating of the glass, damage to the glass plate can be reduced and generation of polymer on the glass plate is suppressed with an improved etching efficiency, so that failure in etching can also be avoided.

15 Claims, 3 Drawing Sheets

METHOD OF ETCHING MATERIAL FILM FORMED ON SEMICONDUCTOR WAFER USING SURFACE WAVE COUPLED PLASMA ETCHING APPARATUS

BACKGROUND OF THE INVENTION

1. Field of the Invention

The present invention relates to methods of etching a material layer formed on a semiconductor wafer, and more particularly, to a method of etching a material layer formed on a semiconductor wafer using a surface wave coupled plasma etching apparatus.

2. Description of the Related Art

As circular semiconductor wafers increase in size as well as in the level of integration of semiconductor devices, the need for an effective etching apparatus for etching fine patterns has increased. In particular, an etching apparatus capable of forming fame patterns, having accurate critical dimensions and uniformity in size, on a large circular semiconductor wafer is required.

A surface wave coupled plasma etching apparatus has been suggested to satisfy this demand. In the surface wave coupled plasma etching apparatus, surface waves generated by an insulation plate are transmitted through a glass plate to a reaction chamber to excite an etching gas, thereby generating plasma. The produced surface wave plasma acts on a semiconductor wafer to etch a material layer, for example, an oxide layer.

The reaction chamber of a conventional surface wave plasma etching apparatus is heated to a high temperature of 180 C. in order to suppress loss of etching gas. However, since the glass plate that transmits surface waves has low heat transfer efficiency, the temperature of the glass plate usually remains at a low temperature of 120–150 C. when a process is not performed, compared to the reaction chamber made of aluminum. Also, it is easy to heat the glass plate to a high temperature of 250 C. during etching process. Due to the low heat transfer efficiency of the glass plate, the temperature distribution across the glass plate is not even during the etching process, resulting in properties of surface wave coupled plasma that are not uniform.

To avoid these problems, a method of preheating the glass plate has been suggested, in which the glass plate is preheated while etching a semiconductor dummy wafer loaded into a reaction chamber using an etching gas, for example, a gas mixture containing $C_4F_8$, CO, $O^2$ and Ar. However, such a glass plate pre-heating method takes more than 30 minutes, and fluorine (F) contained in the etching gas mixture causes damage to the glass plate, reducing the life of the apparatus. Also, carbon (C) contained in the etching gas mixture produces a polymer on the glass plate, thereby making transmission of surface wave coupled plasma through the glass plate difficult.

SUMMARY OF THE INVENTION

An object of the present invention is to provide a method of etching a material layer formed on a semiconductor wafer, by which, with the use of a surface wave coupled plasma etching apparatus, the preheating time of a glass plate that conducts surface waves can be sharply reduced.

In one embodiment, the present invention provides a method of etching a material formed on a semiconductor wafer. Surface waves are generated by an insulation plate of a plasma etching apparatus. The surface waves are transmitted to a glass plate disposed beneath said insulation plate. A gas having a high ion density, such as argon (Ar) or xenon (Xe), is supplied. The glass plate is preheated by exciting the gas prior to etching the material layer.

Preferably, in the step of preheating the glass plate, a bias power of about 500–2500 watts is applied to a lower electrode on which the semiconductor wafer is loaded, and the generated microwaves have a source power of about 1000–4000 watts through the insulation plate. Also, in the step of supplying a gas, a pressure of about 30–60 mTorr is applied in a process chamber in the plasma etching apparatus. The step of etching the material layer preferably includes supplying an oxygen gas into the process chamber of the plasma etching apparatus. Preferably the glass plate is preheated to about 250–350 C. The material layer is preferably an oxide film.

In another embodiment, there is provided a method of etching a material film formed on a semiconductor wafer, the method comprising loading a semiconductor dummy wafer into a reaction chamber of a surface wave coupled plasma etching apparatus which has an insulation plate which is capable of generating surface waves by microwaves, and a glass plate placed below the insulation plate, for transmitting the produced surface waves. Then, the glass plate is rapidly pre-heated by generating an Ar or Xe surface wave coupled plasma which has a high ion density and a large mass. After exhausting the argon or xenon gas which has been used to generate the surface wave coupled plasma, the semiconductor dummy wafer is unloaded. Then, a semiconductor wafer is loaded into the reaction chamber, and an etching gas is supplied into the reaction chamber into which the semiconductor wafer has been loaded. After generating the surface wave coupled plasma by exciting the etching gas, a material film formed on the semiconductor wafer is etched using the plasma generated from the etching gas by surface waves.

In another embodiment, a method is presented for etching an oxide film formed on a semiconductor wafer loaded onto a reaction chamber of a surface wave coupled plasma etching apparatus having an insulation plate capable of generating surface waves by transmission of microwaves of about 1000–4000 watts, and a glass plate placed below the insulation plate, for transmitting the surface waves. The glass plate is preferably preheated by generating an argon (Ar) or xenon (Xe) surface wave coupled plasma which has a high ion density and a large mass, to about 250–350 C. and applying to a lower electrode on which the semiconductor wafer is loaded, a bias power of about 500–2500 watts. The pressure of the process chamber is preferably about 30–60 mTorr.

In the present invention as described above, a gas such as Ar or Xe is used during the etching process which is performed in a surface wave coupled plasma etching apparatus. Because the gas, that is, Ar or Xe, has a high ion density and a large mass, it can preheat the glass plate that transmits surface waves within a short time.

Further objects and advantages of the invention can be more fully understood from the following detailed description taken in conjunction with the accompanying drawings.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF PREFERRED EMBODIMENTS

Figure 1:
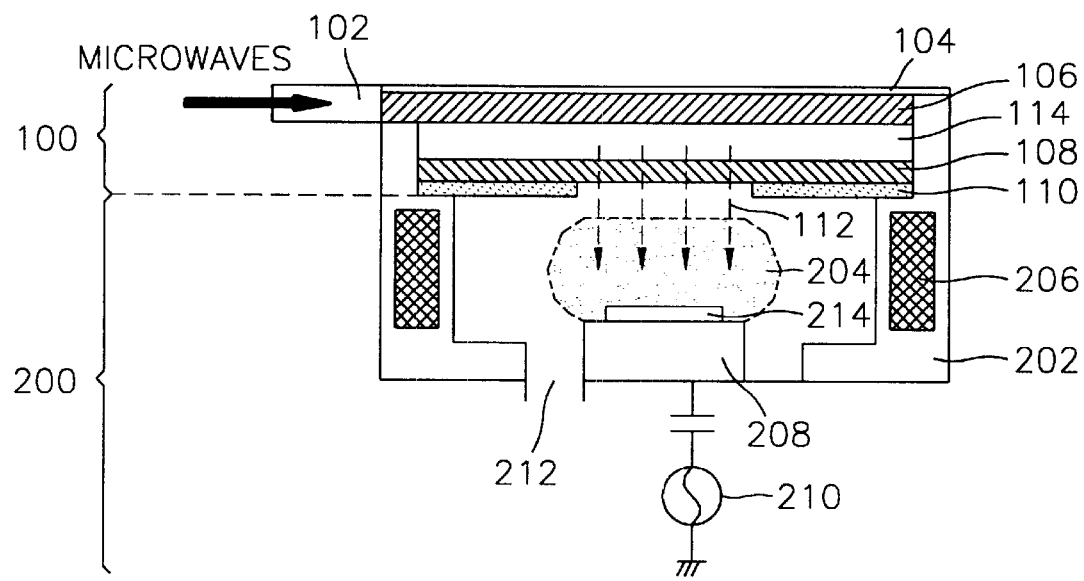
FIG. 1 is a schematic view of a surface wave coupled plasma etching apparatus used in the present invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will filly convey the concept of the invention to those skilled in the art. In the drawings, the thickness of layers and regions are exaggerated for clarity. The same reference numerals in different drawings represent the same element, and thus their description will be omitted.

In FIG. 1, which is a schematic view of a surface wave coupled plasma etching apparatus used in the present invention, the surface wave coupled plasma etching apparatus, which generates plasma by microwaves (2.45 GHz) and performs etching using the plasma, roughly includes an upper region 100 and a lower region 200. The upper region 100 is for generating surface waves from microwaves having a predetermined source power and for confining transfer of the surface waves onto a predetermined area. In particular, the upper region 100 includes a microwave feed portion 102, a microwave guide region 104, an insulation plate 106, a glass plate 108 and an upper electrode 110. The insulation plate 106, preferably formed of Teflon, receives microwaves introduced through the microwave feed portion 102 and the microwave guide 104. Surface waves 112 are generated by the insulation plate 106 as the result of the transmission of microwaves through the insulation plate 106. The produced surface waves 112 are then transferred through the glass plate 108 to a reaction chamber 202. The glass plate 108 is disposed in parallel with and separated by a predetermined distance from the insulation plate 106, and a space between the microwave guide 104 and the glass plate 108 is filled with air. The surface waves 112 generated by the insulation plate 106 are confined to a region corresponding to an object to be etched, by the microwave guide 104, which is preferably formed of aluminum plate on the insulation plate 106, and the upper electrode formed below the glass plate 108.

The lower region 200 contains the reaction chamber 202 in which etching is performed using plasma 204 produced by the surface waves 112 that have been introduced into the upper region 100. The lower region 200 includes a heater 206, the reaction chamber 202, a lower electrode 208 and a radio frequency (RF) power source 210 and a vent 212. The heater 206 is installed to heat the reaction chamber 202, and the lower electrode 208, on which a semiconductor wafer 214 is to be loaded, is disposed in the lower portion of the etching apparatus, facing the upper electrode 110. The RF power source 210 is coupled to the lower electrode 208, to apply RF power thereto.

Figure 2:
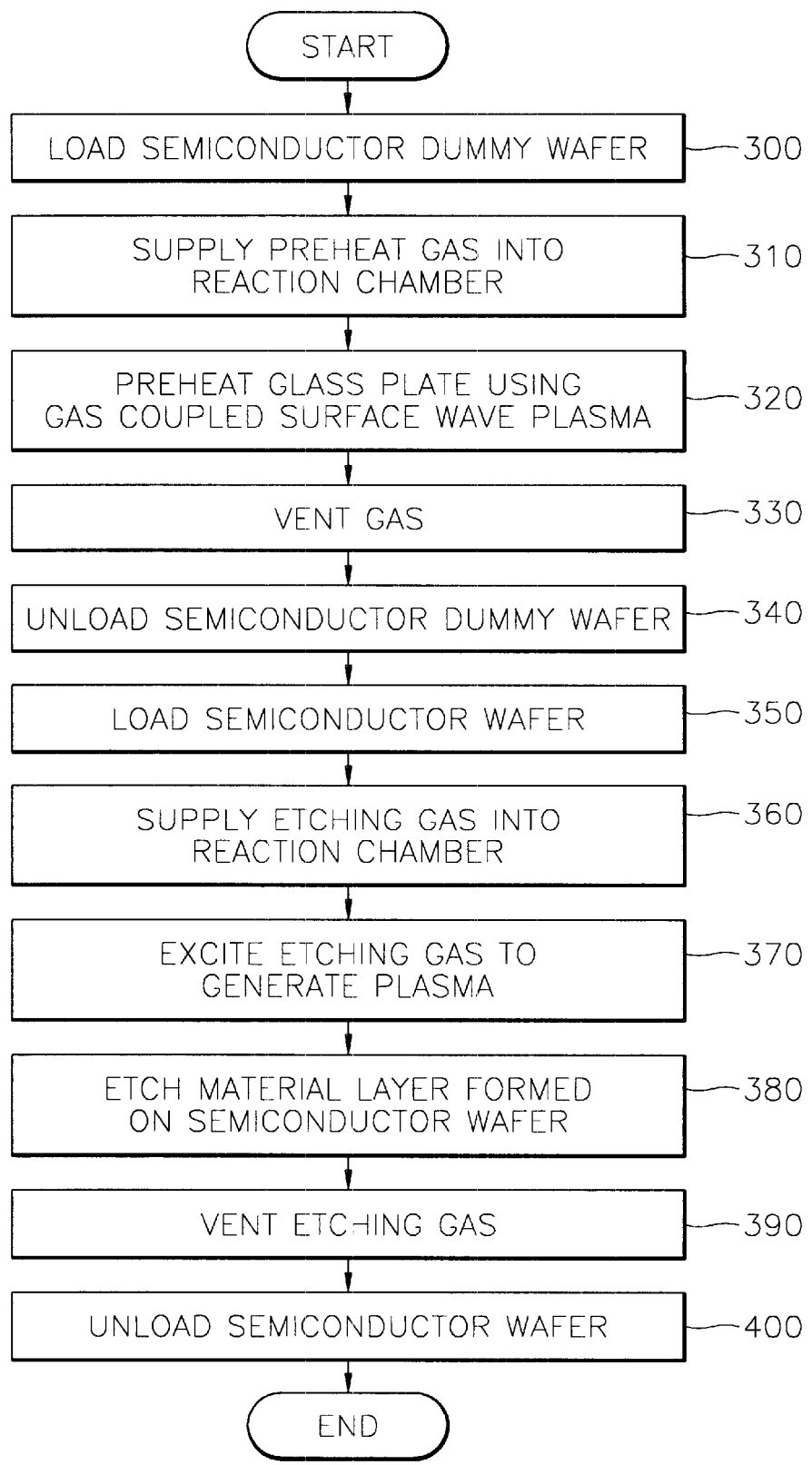
FIG. 2 is a flowchart illustrating a method of etching a material layer formed on a semiconductor wafer by using the surface wave coupled etching apparatus shown in FIG. 1.

FIG. 2 is a flowchart illustrating a method of etching a material layer on a semiconductor wafer according to the present invention, by using the surface wave coupled plasma etching apparatus shown in FIG. 1. In particular, in step 300, a semiconductor dummy wafer is loaded into the reaction chamber 202 of the surface wave coupled plasma etching apparatus having the insulation plate 106 that generates surface waves and the glass plate 108 formed below the insulation plate 106 to transmit the surface waves. Then, a gas, for example, argon (Ar) gas or xenon (Xe) gas, is supplied to the reaction chamber 202, and simultaneously the pressure of the reaction chamber 202 is adjusted to a predetermined level, preferably, 30–60 mTorr (step 310).

Then, microwaves having a source power of more than 100 watts, preferably, about 1,000–4,000 watts, are supplied through the microwave feed portion 102 to induce surface waves from the insulation plate 106, and then the produced surface waves are radiated to the glass plate 108. The gas that has been supplied into the reaction chamber 202 is excited by the surface waves, generating surface wave coupled plasma. At this time, a bias power of more than 500 watts, preferably, about 500–2500 watts, is applied to the lower electrode 208 on which the semiconductor wafer 214 has been loaded. In this way, the glass plate 108 is quickly pre-heated to a temperature of 200 C or higher by the surface wave plasma that has been formed by excitation of the gas (step 320). In particular, if oxygen ($O_2$) gas is further supplied into the reaction chamber 202 between times of generation of surface wave plasma, a chamber cleaning effect is obtained.

The reason for using Ar or Xe gas as the gas that enables the glass plate 108 to be heated rapidly in the surface wave plasma etching apparatus will now be described. It has been found that because the glass plate is heated by bombardment of ions that are generated by the surface wave coupled plasma, heating capability depends on the energy of the ions generated by the surface wave coupled plasma, and the amount of incoming ions, which may be expressed by $$\text{Heat } n_{i} \times E_{ion} \; n_{i} \times V_{dc} \quad (1)$$

From Equation (1), we can see that the heating capability Heat is proportional to the product of the ion density $n_i$ (referred to as "plasma density") that determines the amount of ions, and the ion energy $E_{ion}$. That is, the heating capability Heat rises as the ion density becomes higher or the ion mass becomes larger. Also, the heating capability Heat is proportional to the product of the ion density and the self-bias voltage Vdc. The self-bias voltage is proportional to the bias power applied to a semiconductor wafer. Accordingly, the higher the bias voltage and ion density, the better the heating capability. For this reason, Ar or Xe, each of which is capable of producing ions with high density and large mass, is utilized for generation of surface coupled plasma.

Then, the gas is vented from the reaction chamber (step 330). Then, the semiconductor dummy wafer is unloaded from the semiconductor chamber (step 340), and a semiconductor wafer on which devices are to be formed is loaded into the reaction chamber (step 350).

Subsequently, an etching gas is supplied into the reaction chamber, which allows the reaction chamber to remain a predetermined pressure (step 360). In the case of forming a material layer as an oxide layer on the semiconductor wafer, a gas mixture, in which a fluorine-containing gas, a carbon-containing gas and oxygen gas are mixed, is used as the etching gas. Here, the function of fluorine is for etching, carbon is used to form a polymer, and oxygen acts to remove the polymer. Fluorine-containing gases such as $SF_6$, $NF_3$, $CF_4$, $CHF_3$, $CH_2F_2$, $C_2F_6$, $C_3F_8$ or $C_4F_8$ can be used, and CO gas is used as the carbon-containing gas.

Then, the etching gas is excited to generate surface wave coupled plasma (step 370). The surface wave coupled plasma etches a material layer formed on the semiconductor wafer that is loaded onto the lower electrode (step 380). At this time, radio frequency (RF) power is applied to the lower electrode 208 using a RF power source, to adjust the energy of the surface wave coupled plasma acting on the semiconductor wafer. Then, the etching gas is vented from the reaction chamber (step 390). While the reaction chamber remains at the atmospheric pressure, the semiconductor wafer is unloaded, so that the etching process is completed (step 400).

Figure 3:
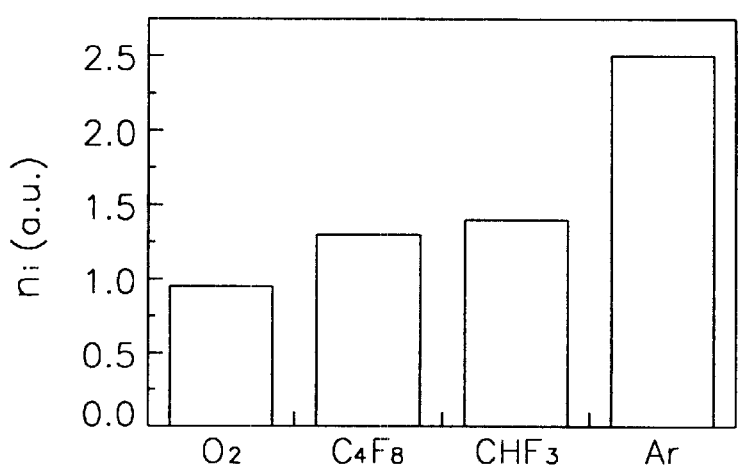
FIG. 3 is a graph illustrating the ion density with respect to a plurality of preheating gases used in the surface wave coupled plasma etching apparatus shown in FIG. 1.

FIG. 3 is a graph showing the ion density with respect to different kinds of preheating gases to generate plasma in the surface wave coupled plasma etching apparatus shown in FIG. 1. In particular, the X-axis represents kinds of preheating gases, and the Y-axis represents the ion density. Here, the gases used are $O_2$, $C_4F_8$, $CHF_3$ and Ar. As shown in FIG. 3, the ion density increases in order of $O_2$, $C_4F_8$, $CHF_3$ and Ar, which are used as an etching gas. From this result, it can be seen that the capability of heating the glass plate sequentially increases where $O_2$, $C_4F_8$, $CHF_3$ and Ar are used. Also, when an etching process is performed using the surface wave coupled plasma etching apparatus shown in FIG. 1, the preheating time required for heating the glass plate to 250–350 C is about five minutes in the case of using Ar as a gas and is about 37 minutes in the case of using a mixture of $C_4F_8$, CO, $O_2$ and Ar as a gas.

Figure 4:
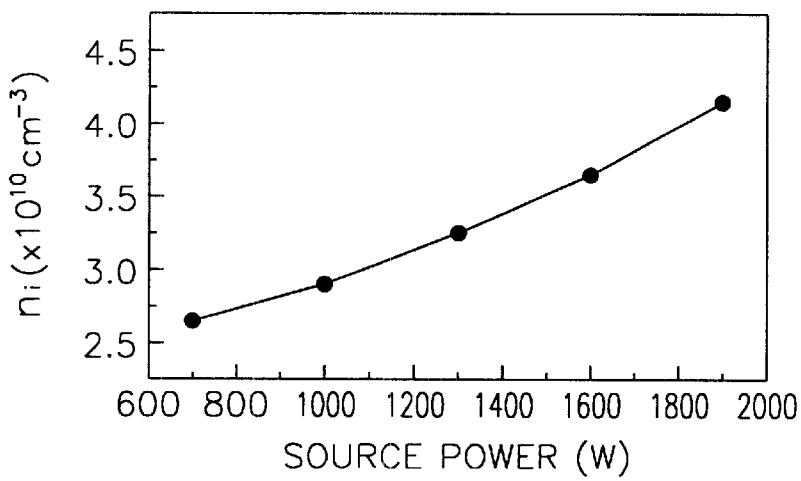
FIGS. 4 and 5 are graphs illustrating the ion density with respect to source power and process pressure, respectively, when Ar plasma is generated using surface wave coupled plasma etching apparatus of FIG. 1.
Figure 5:
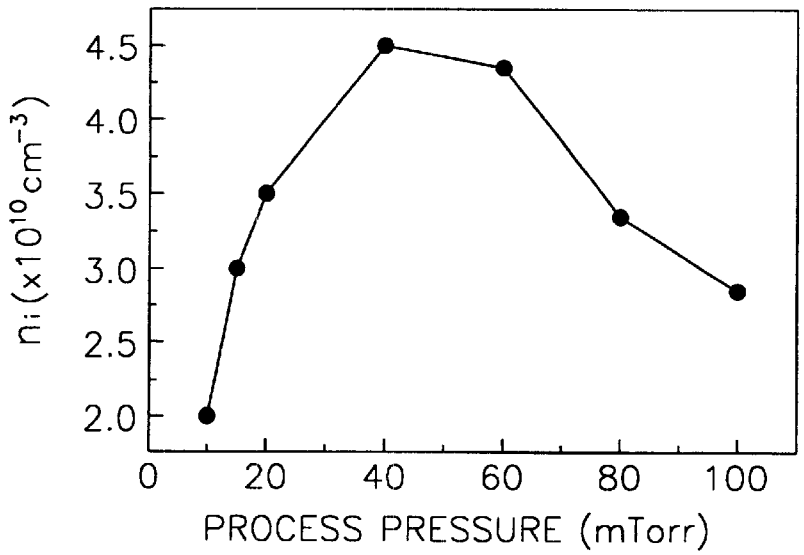

FIGS. 4 and 5 are graphs illustrating the ion density with respect to source power and process pressure which affect the generation of surface wave coupled plasma, respectively, when Ar plasma is generated using the surface wave coupled plasma etching apparatus shown in FIG. 1. As shown in FIGS. 4 and 5, the higher the source power, the higher the ion density. Also, the ion density is higher at a process pressure of 30–60 mTorr. From these results, it may be concluded that heating of the glass plate is effective at a higher source power and a process pressure of 30–60 mTorr.

As described above, when etching is carried out using the surface wave coupled plasma etching apparatus, heating of the glass plate that transmits surface waves can be accelerated in generation of surface wave coupled plasma, by using a gas such as Ar or Xe that has a high ion density and a large mass, instead of using an etching gas. That is, the preheating time of the glass plate can be sharply reduced to less than five minutes, in contrast to more than 30 minutes taken in a conventional etching process. Also, because the etching gas is not used for the heating of the glass, damage to the glass plate can be reduced and generation of polymer on the glass plate is suppressed with an improved etching efficiency, so that failure in etching can also be avoided.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of etching a material layer formed on a semiconductor wafer, comprising the steps of:
    supplying a gas having a high ion density into a reaction chamber disposed beneath a glass plate of a plasma etching apparatus, wherein the gas having a high ion density consists of xenon (Xe);
    generating surface waves from an insulation plate of the plasma etching apparatus;
    transmitting the surface waves to the glass plate disposed beneath the insulation plate; and
    preheating the glass plate by exciting the gas with the surface waves prior to etching the material layer before loading a product wafer.

2. The method of claim 1, wherein the step of preheating the glass plate includes applying a bias power of about 500–2500 watts to a lower electrode on which the semiconductor wafer is loaded.

3. The method of claim 1, wherein the step of generating surface waves includes generating microwaves having a source power of about 1000–4000 watts through the insulation plate.

4. The method of claim 1, wherein the step of supplying a gas includes applying a pressure of about 30–60 mTorr in a process chamber in the plasma etching apparatus.

5. The method of claim 1, wherein the step of etching the material layer includes supplying an oxygen gas into a process chamber of the plasma etching apparatus.

6. The method of claim 1, wherein the step of etching the material layer includes preheating the glass plate to about 250–350° C.

7. The method of claim 1, wherein the material layer is an oxide film.

8. A method for etching a material layer formed on a semiconductor wafer comprises the steps of:
    loading a semiconductor dummy wafer into a reaction chamber of a surface wave coupled plasma etching apparatus having an insulation plate capable of generating surface waves by transmission of microwaves, and a glass plate placed below the insulation plate, for transmitting the produced surface waves;
    pre-heating the glass plate by generating a surface wave coupled plasma consisting of xenon (Xe) which has a high ion density and a large mass;
    exhausting the argon or xenon gas which has been used to generate the surface wave coupled plasma;
    unloading the semiconductor dummy wafer;
    loading a semiconductor wafer into the reaction chamber;
    injecting an etching gas into the reaction chamber into which the semiconductor wafer has been loaded;
    generating the surface wave coupled plasma by exciting the etching gas; and
    etching a material layer formed on the semiconductor wafer using the plasma generated from the etching gas by surface waves.

9. The method of claim 8, wherein the step of generating the surface wave coupled plasma includes applying a bias power of about 500–2500 watts to a lower electrode on which the semiconductor wafer is loaded.

10. The method of claim 8, wherein the step of generating the surface wave coupled plasma includes applying about 1000–4000 watts which generates the surface waves.

11. The method of claim 8, wherein the step of generating the surface wave coupled plasma includes applying a pressure in the process chamber at about 30–60 mTorr.

12. The method of claim 8, wherein the step of generating the surface wave coupled plasma includes supplying an oxygen gas into the process chamber.

13. The method of claim 8, wherein the glass plate is pre-heated to about 250–350° C.

14. The method of claim 8, wherein the material layer is an oxide film.

15. The method of claim 8, wherein the etching gas is a mixture of a fluorine containing gas, a carbon containing gas and an oxygen containing gas.

* * * * *